US012573454B2

(12) United States Patent
Ameen et al.

(10) Patent No.: US 12,573,454 B2
(45) Date of Patent: Mar. 10, 2026

(54) POWER EFFICIENT ARRAY DISCHARGE FOR PROGRAM BOOSTING

(71) Applicant: Intel NDTM US LLC, Santa Clara, CA (US)

(72) Inventors: Tarek Ameen, San Jose, CA (US); Shantanu Rajwade, Santa Clara, CA (US); Hsiao Yu Chang, Sunnyvale, CA (US); Rohit Shenoy, Fremont, CA (US); Pranav Chava, Folsom, CA (US); Xin Sun, Fremont, CA (US); Pratyush Chandrapati, Vancouver (CA)

(73) Assignee: Intel NDTM US LLC, Santa Clara, CA (US)

( * ) Notice: Subject to any disclaimer, the term of this patent is extended or adjusted under 35 U.S.C. 154(b) by 805 days.

(21) Appl. No.: 17/732,117

(22) Filed: Apr. 28, 2022

(65) Prior Publication Data

US 2023/0352092 A1     Nov. 2, 2023

(51) Int. Cl.
| | |
|---|---|
| *G11C 16/34* | (2006.01) |
| *G11C 16/04* | (2006.01) |
| *G11C 16/08* | (2006.01) |
| *G11C 16/10* | (2006.01) |

(52) U.S. Cl.
CPC .......... *G11C 16/10* (2013.01); *G11C 16/0483* (2013.01); *G11C 16/08* (2013.01); *G11C 16/3459* (2013.01)

(58) Field of Classification Search
CPC ...................................................... G11C 16/34
See application file for complete search history.

(56) References Cited

U.S. PATENT DOCUMENTS

2009/0067247 A1*   3/2009   Park ................... G11C 16/3454
                                                              365/185.17

* cited by examiner

*Primary Examiner* — Jason Lappas
(74) *Attorney, Agent, or Firm* — Morgan, Lewis & Bockius LLP

(57) ABSTRACT

Systems, apparatuses and methods may provide for technology that issues a program pulse to a selected subblock of a NAND memory array, conducts a pulse recovery phase after the program pulse, and shuts down unselected subblocks in the NAND memory array during the pulse recovery phase.

20 Claims, 5 Drawing Sheets

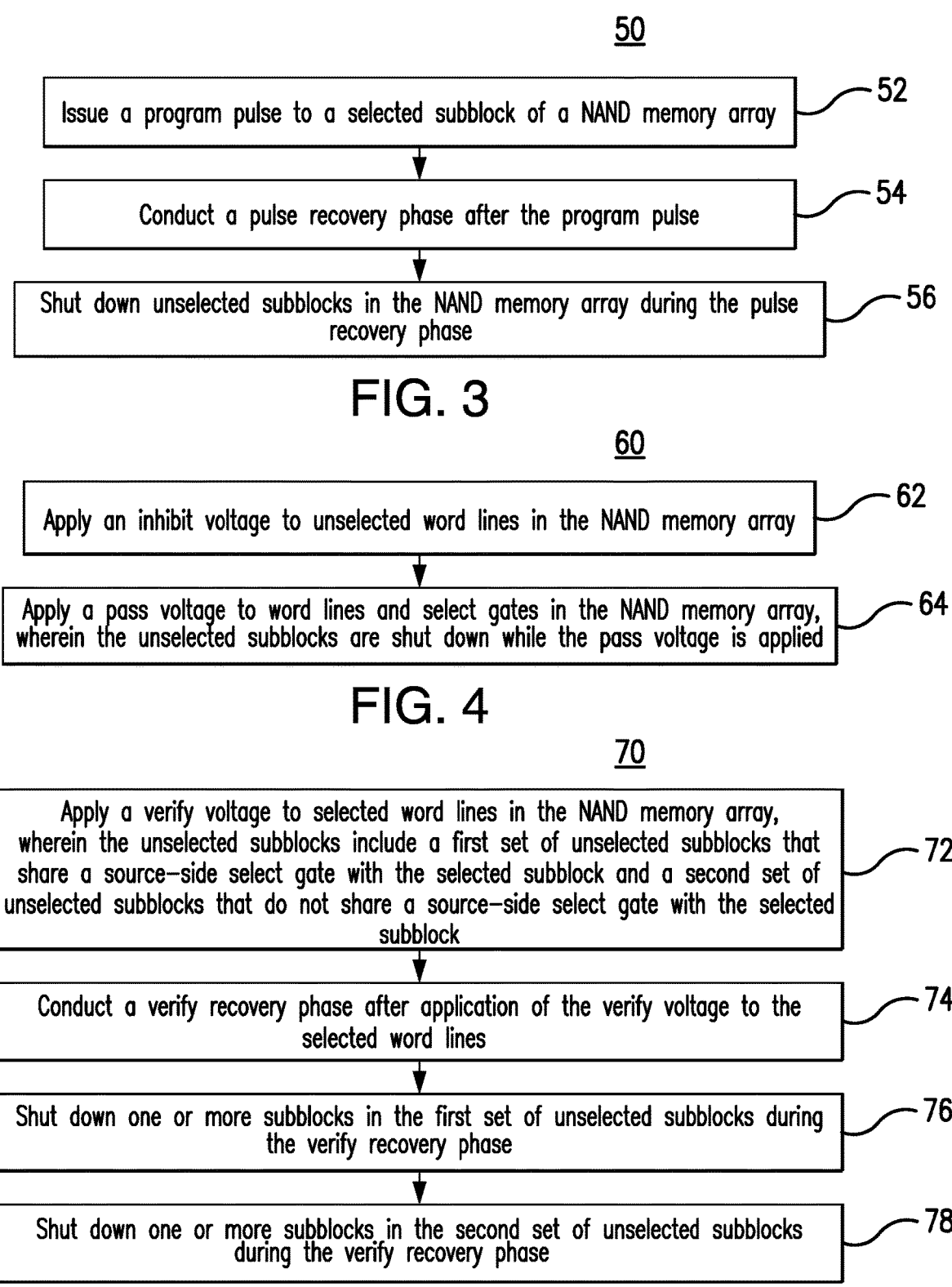

50

| Issue a program pulse to a selected subblock of a NAND memory array | ~52 |

| Conduct a pulse recovery phase after the program pulse | ~54 |

| Shut down unselected subblocks in the NAND memory array during the pulse recovery phase | ~56 |

| Apply an inhibit voltage to unselected word lines in the NAND memory array | ~62 |

| Apply a pass voltage to word lines and select gates in the NAND memory array, wherein the unselected subblocks are shut down while the pass voltage is applied | ~64 |

| Apply a verify voltage to selected word lines in the NAND memory array, wherein the unselected subblocks include a first set of unselected subblocks that share a source-side select gate with the selected subblock and a second set of unselected subblocks that do not share a source-side select gate with the selected subblock | ~72 |

| Conduct a verify recovery phase after application of the verify voltage to the selected word lines | ~74 |

| Shut down one or more subblocks in the first set of unselected subblocks during the verify recovery phase | ~76 |

| Shut down one or more subblocks in the second set of unselected subblocks during the verify recovery phase | ~78 |

FIG. 5

POWER EFFICIENT ARRAY DISCHARGE FOR PROGRAM BOOSTING

TECHNICAL FIELD

Embodiments generally relate to memory structures. More particularly, embodiments relate to power efficient array discharge for program boosting in NAND flash memory structures.

BACKGROUND

To program cells in a NAND flash memory, a series of program pulses may be applied to a selected word line (WL) that corresponds to the page address to be programmed. Each program pulse (e.g., Vpgm) is typically followed by a set of verify operations to compare the threshold voltage of the cells being programmed against verify voltages (e.g., Pv) that correspond to the level at which each cell is to be programmed. The process of programming and verifying is typically iterative and a program pulse followed by a number of program verify operations may be referred to as a pulse-verify loop. More particularly, Pv is applied to the select WL and a pass voltage (e.g., Vpass) is applied to others to nullify them and allow sensing to be focused on the selected WL only.

Once a cell has passed the verify operation ("verify") of the respective targeted level, a bit line (BL) connected to the cell is used to inhibit any additional programing of the cell. In addition to cells passing the verify operation on a selected subblock of the NAND memory array, all unselected cells either on the selected subblock or unselected subblocks (majority) are also inhibited. The basic principle of inhibiting/boosting a cell involves applying a high potential to the channel of the cell, where the high potential is different from the potential of the programmed cell that has a grounded channel (0V). Therefore, when the programming pulse is applied to the selected WL, the inhibited cell will "feel" a smaller voltage difference than the program voltage.

To prevent any existing charge from weakening the boosting process, the verified and unselected cells may be equalized, discharged and isolated (e.g., array discharge) prior to inhibiting the verified and unselected cells. Conventional array discharge approaches, however, may substantially increase power consumption, which may have a negative impact on scalability, storage density and/or performance.

BRIEF DESCRIPTION OF THE DRAWINGS

The various advantages of the embodiments will become apparent to one skilled in the art by reading the following specification and appended claims, and by referencing the following drawings, in which:

FIG. 3 is a flowchart of an example of a method of operating a performance-enhanced memory chip controller according to an embodiment;

FIG. 4 is a flowchart of an example of a method of conducting a pulse recovery phase according to an embodiment;

FIG. 5 is a flowchart of an example of a method of conducting cell verification and a verify recovery phase according to an embodiment.

DESCRIPTION OF EMBODIMENTS

In recent years, vertical memory, such as three-dimensional (3D) memory has been developed. A 3D flash memory (e.g., 3D NAND memory array) device may include a plurality of strings of charge storage devices (memory cells) stacked over one another (e.g., in a first of three dimensions of 3D) with each charge storage device corresponding to one of multiple tiers of the device. The charge storage devices of a respective string may share a common channel region, such as one formed in a respective pillar of semiconductor material (e.g., polysilicon) about which the string of charge storage devices may be formed.

In a second dimension, each first group of the plurality of strings may comprise, for example, a group of strings sharing a plurality of access lines, known as word lines (WLs). Each of the plurality of access lines may couple (e.g., electrically or otherwise operably connect) the charge storage devices (memory cells) corresponding to a respective tier of the plurality of tiers of each string. The charge storage devices coupled by the same access line (and thus corresponding to the same tier) may be logically grouped into memory pages, where each charge storage device includes a multi-level cell capable of storing two or more bits of information. In a third dimension, each group of the plurality of strings may include a group of strings coupled by corresponding data lines, known as bitlines (BLs).

Figure 1:
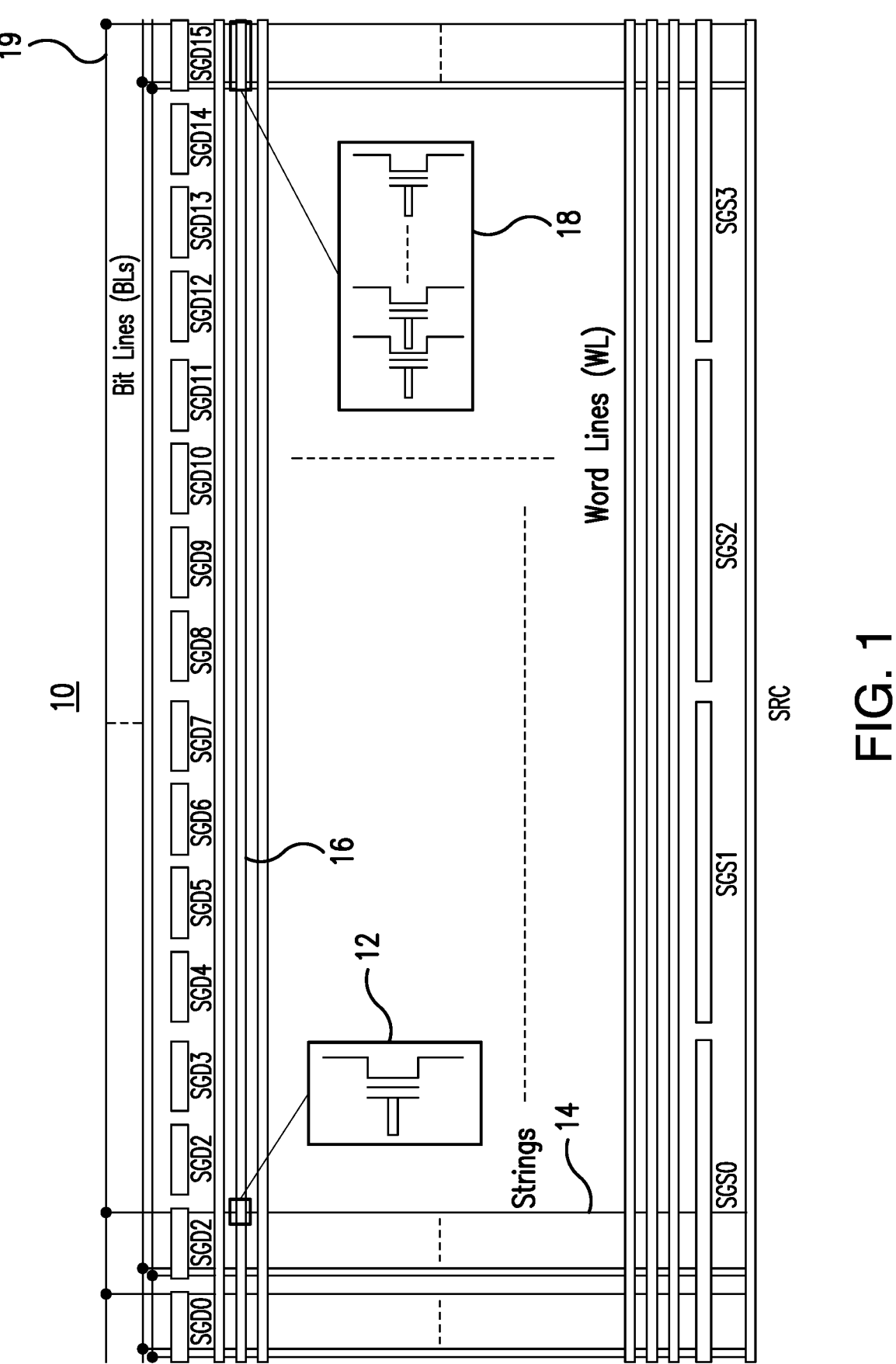
FIG. 1 is a schematic diagram of an example of a NAND memory array according to an embodiment.

Turning now to FIG. 1, a 3D NAND memory array 10 is shown in which a group of cells 12 (e.g., floating gates, charge traps) are accessible through various control signals to perform basic memory operations. In general, each cell 12 is located at the intersection of a string such as, for example, a string 14 and a word line such as, for example, a WL 16. A page 18 is the programmable unit of the array 10 and is accessible within a block by selecting a word line, a drain-side select gate (SGD, e.g., "SGD15"), and a source-side select gate (SGS, e.g., "SGS3"). Bit lines such as, for example, a bit line 19, may be used to address the individual strings or cells inside the page 18.

Each cell 12 can store a few binary bits (n) and therefore has the capability to be programmed to $2^n$ levels (e.g., four bit per cells is programmed to sixteen distinguishable levels). For example, programing the desired different levels of various the cells in the page 18 involves issuing a series of programing pulses that are applied to the selected ("Sel") word line to inject electrons in the charge storage (e.g., trap/floating gate, etc.). Each pulse is followed by a series of verify operations ("verifies"), which in principle are read operations to detect whether each cell has reached the targeted programming level. Once a cell has passed the verify of the targeted level, the bit line is used to inhibit any additional programing of the cell by shutting down the bit line-to-select gate junction. In addition to cells passing verify on the selected sub block, all cells on unselected ("Unsel") subblocks (e.g., controlled by different SGDs) are always inhibited.

Figure 2A:
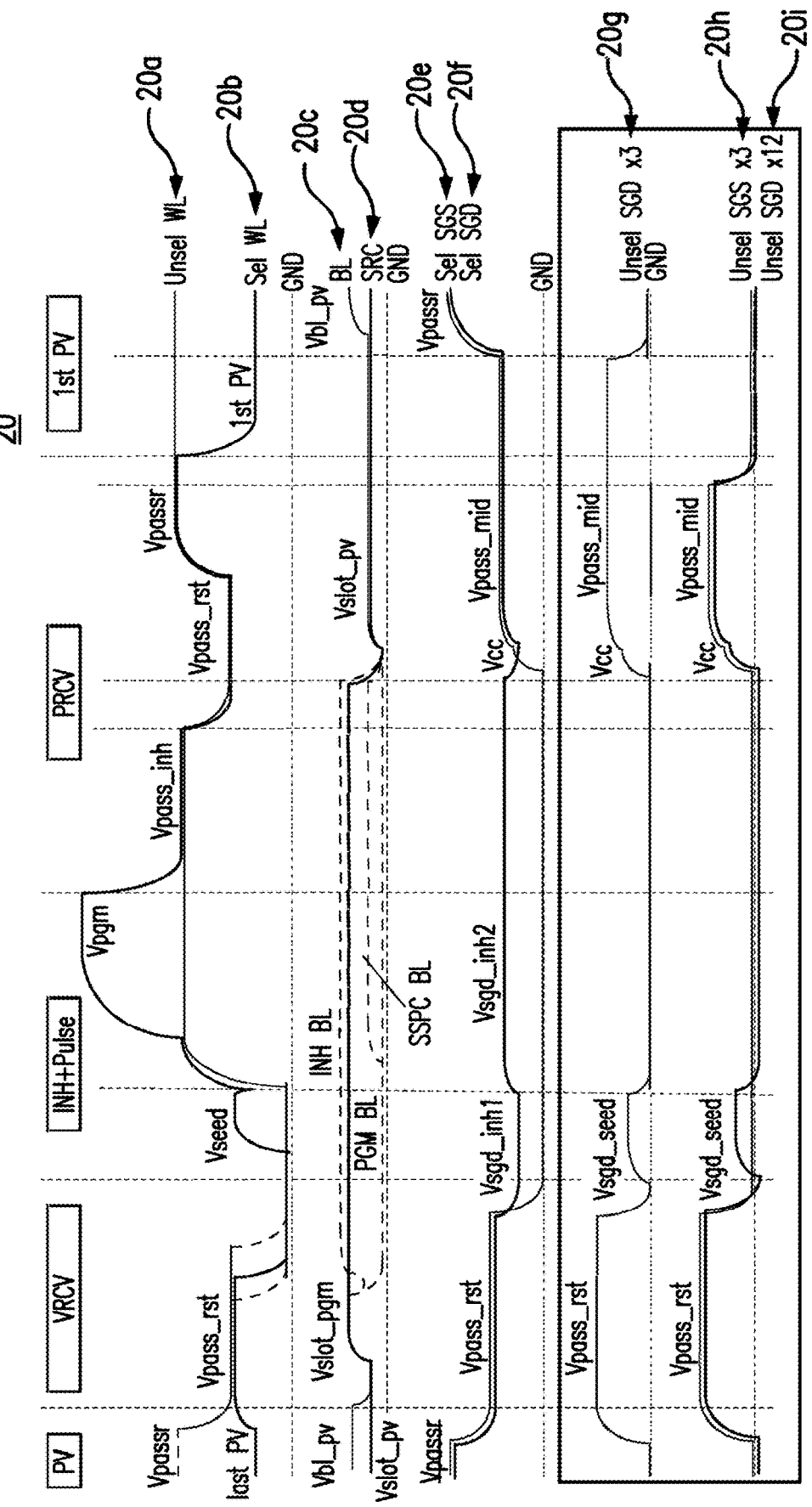
FIGS. 2A and 2B are waveform diagrams comparing a conventional set of control voltages and an enhanced set of control voltages according to an embodiment.
Figure 2B:
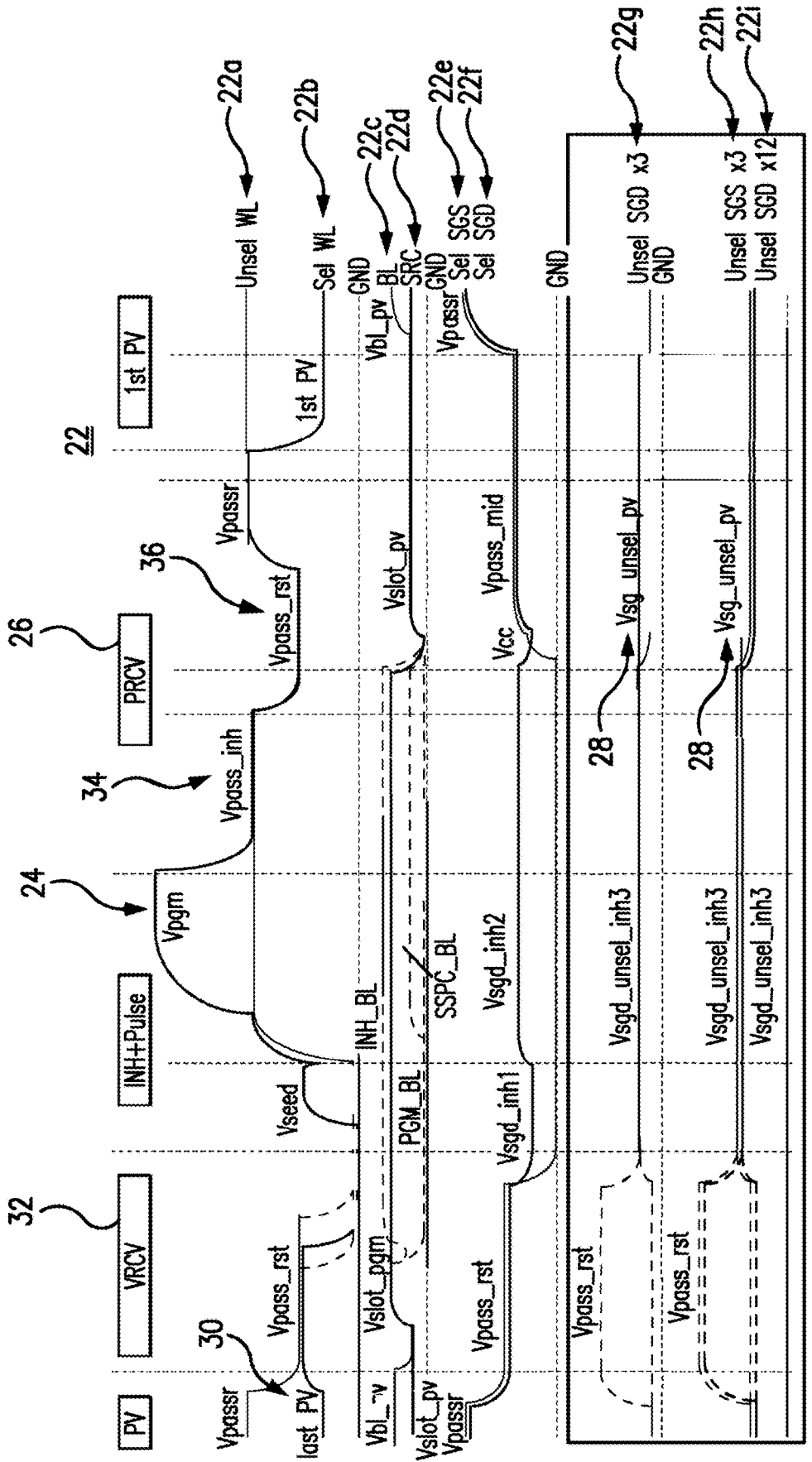

With continuing reference to FIGS. 1, 2A, and 2B, a conventional set of control signals 20 (20a-20i) and an enhanced set of control signals 22 (22a-22i) is shown with respect to the NAND memory array 10. The basic principle of boosting or inhibiting a cell involves applying a relatively high potential (e.g., Vpass_inh up to 10 Volts (V)) to the channel, wherein the relatively high potential is different from the potential of a programmed cell that has a grounded channel (0V). Therefore, when a programming pulse (Vpgm) is applied to the selected WL via a selected WL signal 20b, the inhibited cell will only feel a voltage difference of (Vpgm-Vpass_inh) instead of Vpgm.

In general, the inhibited voltage (Vpass_inh) is applied to the unselected WLs via an unselected WL signal 20a during a pulse recovery (PRCV) phase. For Vpass_inh to be electrostatically transferred to the channels of the inhibited strings, the strings are completely discharged and isolated as any present electrons can mirror Vpass_inh and either weaken or eliminate the boosting. Isolating the inhibited pillars is straightforward, since the unselected subblocks have their respective unselected SGSs and SGDs grounded during the pulse phase via signals 20g-20i. Additionally, the inhibited pillars on the selected subblock have their respective SGD junctions shut down by using a BL signal 20c to increase an INH BL voltage to Vcc, which shuts down the SGD-to-BL junction and effectively isolates the pillar. The conventional set of control signals 20 discharge the array 10, however, before isolating the inhibited pillars since any existing charge may weaken the boosting and cause major program disturbances.

More particularly, discharge of the array 10 begins during the pulse recovery (PRCV) phase by deboosting the array 10 and using signals 20e-20i to turn on all select gates, even for unselected subblocks. This approach helps equalize the channel and prepare the array 10 for a staggered discharge, which occurs during a verify recovery (VRCV) phase. In the VRCV phase, a careful discharge is performed via, for example, a staggered discharge operation in which all WLs and select gates are charged to Vpass_rst and one or a group of WLs is taken to the ground after another, pushing the electrons out of the array 10.

The conventional set of control signals 20, however, discharge the array 10 in an energy expensive process and for all subblocks, regardless of whether the subblock is selected or unselected. For example, the discharge is only partially conducted during the VRCV phase. As already noted, the array 10 is first equalized by taking all word lines and select gates to a passing potential (Vpass_rst). This process is done to some extent during the PRCV phase (e.g., Vpass_mid) and at the beginning of the VRCV phase. Then, a rigorous stagger discharge of the array 10 is done by taking the potential of one bundle of word lines after another to the ground, causing a waterfall of electrons exiting the pillars.

A challenge with the conventional set of control signals 20 is the associated high-power consumption in both the PRCV phase and the VRCV phase. This power consumption is proportional to the number of subblocks (M) and number of WLs (N). Assuming that the local capacitance of every WL to the ground per subblock is (Cwg) and the coupling capacitance between two WLs per subblock is (Cww), the charge to be supplied to the WLs to stabilize them to Vpass_rst (e.g., mostly during PRCV and partially during VRCV), comes from turning on the boosted pillars that were floating. As a result, the associated word lines are connected to ground capacitances and supply charge to provide the Vpass_rst to these capacitances. The inhibited pillars are part of the unselected subblocks and the inhibited bit lines on the selected subblock (e.g., the respective ratio is i), so the relevant consumed charge in the array 10 would be Q_rst:

$$Q_{rst}=N(M-1+i)C_{wg}\text{Vpass}_{rst}-NM\ C_{wg}\text{Vpass}_{rst} \qquad (1)$$

The other component of the discharge is primarily associated with the action of staggering due to the local WL-to-WL coupling capacitance. While a WL is taken to ground, the neighboring WL will draw current to keep its respective voltage at Vpass_rst, assuming that the number of effective staggering steps is n. Then, the consumed charge in conducting the staggering is Q_stg:

$$Q_{stg}=n\ M\ C_{ww}\text{Vpass}_{rst} \qquad (2)$$

The overall charge associated with array discharge consumed in the array is the sum of both equations (1) and (2)

$$Q=N(M-1+i)C_{wg}\text{Vpass}_{rst}+n\ M\ C_{ww}\text{Vpass}_{rst} \qquad (3)$$

By contrast, the enhanced set of control signals 22 provide a preventative and much more efficient way to protect the boosting. More particularly, the enhanced set of control signals 22 avoid introducing unnecessary charges into the array 10 instead of relying on discharge to protect the boosting. The technology described herein eliminates most of the discharge energy cost, which is more than a 7% reduction in the overall programming energy on a state of the art 3D NAND technology. The benefits are even greater as physical array scaling continues in ongoing and future technologies. The basic principle is to avoid introducing the charge into the inhibited pillars wherever possible and use charge preventive measures rather than an expensive discharge of the array.

Embodiments maintain the boosting of the inhibited pillars, wherever possible, and protect the inhibited pillars from leakage or any charges that may weaken boosting. This approach eliminates or significantly reduces the energy spent on array discharge.

More particularly, the technology described herein leverages the fact that there are two types of unselected subblocks, the subblocks sharing the same SGS with the selected subblock (e.g., "Unsel SGS ×3") and the subblocks located on other SGSs (e.g., "Unsel SGSs ×12"). The ×12 subblocks being separated from the selected SGS subblocks gives the ×12 subblocks an advantage with respect to optimization. Changes in the enhanced set of control signals 22 include:

1) Shutting down all unselected SGSs and SGDs during the PRCV phase;
2) Making the VRCV phase alone responsible for the discharge of the array 10;
3) Shutting down all SGDs and SGSs during the VRCV phase by default, and turning the SGDs and SGSs on independently at specific loops (e.g., latest loops) based on the loop type. It is quite unlikely that the ×12 subblocks would need to have their respective select gates turned on during the VRCV phase even during the latest loops. The ×3 subblocks and selected subblock may need to have their respective select gates turned on during the latest loops in some marginal locations in the block that are susceptible to program disturbances.
4) Adjusting the unsel SGS and unsel SGD bias for every other section in the waveform to prevent various types of leakage (e.g., since source and BL voltages change).

More particularly, the "×12" subblocks are all pillars located on the unselected SGSs (e.g., not being constrained by sharing the same SGS with the selected sub block). The ×12 subblocks have the largest degree of freedom and therefore yield the most prospect for optimization. The change from the conventional set of control signals 20 is to keep SGS and SGD of the ×12 subblocks shut down everywhere in the program waveform, including the PRCV phase and the VRCV phase. The select gate biases may be optimized for every section of the waveform to prevent leakage. The NAND internal controller has the ability, however, to turn on the SGS and SGD of the ×12 subblocks during the VRCV phase if discharge of the array 10 is appropriate, which may only occur in rare/marginal cases.

The "×3" subblocks are all the pillars on the unselected subblocks (e.g., unselected SGDs) that share the same SGS with the selected SGS. The ×3 subblocks are constrained by being turned on with the selected SGS during the PRCV phase and the series of verifies that may contribute to equalize their respective pillars to some extent. This effect is mitigated by shutting down the SGDs of the ×3 subblocks during the PRCV phase. This approach reduces the burden on the VRCV, particularly during initial loops.

The inhibited pillars on the selected subblock is where most of the VRCV is useful since it is unavoidable to turn on both the selected SGD and SGS during the PRCV phase and the verify operations. Moreover, the power reduction prospect is the lowest for the inhibited pillars on the selected subblock since the pillars amount to a capacitance that is less than that coming from one subblock (e.g., prospect is <1/M, where M here is sixteen in the illustrated example). Therefore, there is no change in the enhanced set of control signals 22 compared to conventional set of control signals 22 with respect to the inhibited pillars on the selected subblock.

In the illustrated example, a program pulse 24 is issued to a selected subblock of the NAND memory array 10 via a Sel WL signal 22b. Additionally, a pulse recovery (PRCV) phase 26 is conducted after the program pulse 24. Unselected subblocks in the NAND memory array are shut down in a waveform region 28 during the pulse recovery phase 26. As already noted, the unselected subblocks may include a first set of unselected subblocks (e.g., ×3) that share a source-side select gate (e.g., SGS3) with the selected subblock and a second set of unselected subblocks (e.g., ×12) that do not share a source-side select gate (SGS0-SGS2) with the selected subblock.

Moreover, conducting the pulse recovery phase 26 may involve applying an inhibit voltage 34 to unselected word lines in the NAND memory array 10 and applying a pass voltage 36 to word lines and select gates in the NAND memory array 10. In such a case, the unselected subblocks may be shut down while the pass voltage 36 is applied. As already noted, a bias of the unselected subblocks may be adjusted based on, for example, a leakage constraint. In one example, the selected subblock is located at the intersection of a drain-side select gate (SGD) and a word line (WL).

In an embodiment, a verify voltage 30 (e.g., pulse verify/PV) is applied to selected word lines in the NAND memory array 10 via the Sel WL signal 22b, wherein a verify recovery (VRCV) phase 32 is conducted after application of the verify voltage 30 to the selected word lines. Signals 22g and 22h demonstrate that one or more subblocks in the first set of unselected subblocks may be shut down during the verify recovery phase 32. Signals 22g and 22h also demonstrate that one or more subblocks in the first set of unselected subblocks may be turned on based on a loop type associated with the program pulse 24. Additionally, signal 22i demonstrates that one or more subblocks in the second set of unselected subblocks may be shut down during the verify recovery phase 32.

Assuming that only the ×12 subblocks completely avoid conducting the discharge while the ×3 subblocks and the selected subblock always conduct the discharge (e.g., a conservative estimation of the benefit), the local WL capacitance associated with the ×12 subblocks is floating and does not consume discharge power. In the example of sixteen subblocks, this eliminates twelve out of the sixteen in M of equation (3), which saves more than 75% of the discharge energy. Generally, if the number of ×12 subblocks is notated as S, then the amount of charge saved from equation (3) is:

$$Q_{saved}=N\ S\ C_{wg}\mathrm{Vpass}_{rst}+n\ S\ C_{ww}\mathrm{Vpass}_{rst} \qquad (4)$$

Additionally, the remaining charge that is still being spent on array discharge is:

$$Q=N(M-S-1+i)C_{wg}\mathrm{Vpass}_{rst}+n(M-S)C_{ww}\mathrm{Vpass}_{rst} \qquad (3)$$

A variation that avoids discharging the ×12 SGDs and SGSs but still performs discharge on the selected sub block and the ×3 has shown to save a substantial amount of the entire programming operation power consumption with no downside in placement or endurance capabilities. These benefits are achieved by ensuring that no charges are introduced to the ×12 inhibited pillars during other parts of the waveforms, particularly during the PRCV phase 26 which may otherwise damage the boosting and cause program disturbances. One approach to preventing the introduction of these charges is to appropriately bias the select gates with respect to source and bit lines during other parts of the waveform.

FIG. 3 shows a method 50 of operating a memory chip controller. The method 50 may be implemented in one or more modules as a set of logic instructions stored in a machine- or computer-readable storage medium such as random access memory (RAM), read only memory (ROM), programmable ROM (PROM), firmware, flash memory, etc., in hardware, or any combination thereof. For example, hardware implementations may include configurable logic, fixed-functionality logic, or any combination thereof. Examples of configurable logic include suitably configured programmable logic arrays (PLAs), field programmable gate arrays (FPGAs), complex programmable logic devices (CPLDs), and general purpose microprocessors. Examples of fixed-functionality logic include suitably configured application specific integrated circuits (ASICs), combinational logic circuits, and sequential logic circuits. The configurable or fixed-functionality logic can be implemented with complementary metal oxide semiconductor (CMOS) logic circuits, transistor-transistor logic (TTL) logic circuits, or other circuits.

Illustrated processing block 52 provides for issuing a program pulse to a selected subblock of a NAND memory array, wherein block 54 conducts a pulse recovery phase after the program pulse. In an embodiment, the selected subblock is located at an intersection of a SGD and a WL. Block 56 shuts down unselected subblocks in the NAND memory array during the pulse recovery phase. In one example, block 56 includes adjusting a bias of the unselected subblocks based on, for example, a leakage constraint (e.g., biases optimized to minimize leakage). The method 50 therefore enhances performance at least to the extent that shutting down the unselected subblocks during the pulse recovery phase decreases power consumption, improves scalability and/or increases storage density.

FIG. 4 shows a method 60 of conducting a pulse recovery phase. The method 60 may generally be incorporated into blocks 54 and 56 (FIG. 3), already discussed. More particularly, the method 60 may be implemented in one or more modules as a set of logic instructions stored in a machine- or computer-readable storage medium such as RAM, ROM, PROM, firmware, flash memory, etc., in hardware, or any combination thereof.

Illustrated processing block 62 applies an inhibit voltage to unselected word lines in the NAND memory array. Block 64 may apply a pass voltage to word lines and select gates in the NAND memory array, wherein the unselected subblocks are shut down while the pass voltage is applied. The method 60 therefore further enhances performance at least to the extent shutting down the unselected subblocks while the pass voltage is being applied prevents charge from being introduced into the inhibited pillars.

FIG. 5 shows a method 70 of conducting cell verification and a verify recovery phase. The method 70 may generally be implemented in conjunction with the method 50 (FIG. 3), already discussed. More particularly, the method may be implemented in one or more modules as a set of logic instructions stored in a machine- or computer-readable storage medium such as RAM, ROM, PROM, firmware, flash memory, etc., in hardware, or any combination thereof.

Illustrated processing block 72 applies a verify voltage to selected word lines in the NAND memory array, wherein the unselected subblocks include a first set of unselected subblocks that share a SGS with the selected subblock and a second set of unselected subblocks that do not share the SGS with the selected subblock. Block 74 conducts a verify recovery phase after application of the verify voltage to the selected word lines. In an embodiment, block 76 shuts down one or more subblocks in the first set of unselected subblocks during the verify recovery phase and block 78 shuts down one or more subblocks in the second set of unselected subblocks during the verify recovery phase. In one example, block 76 also turns on one or more subblocks in the first set of unselected subblocks based on a condition such as, for example, a loop type associated with the program pulse. The method 70 therefore further enhances performance at least to the extent that shutting down unselected subblocks during the VRCV phase further decreases power consumption, improves scalability and/or increases storage density.

Figure 6:
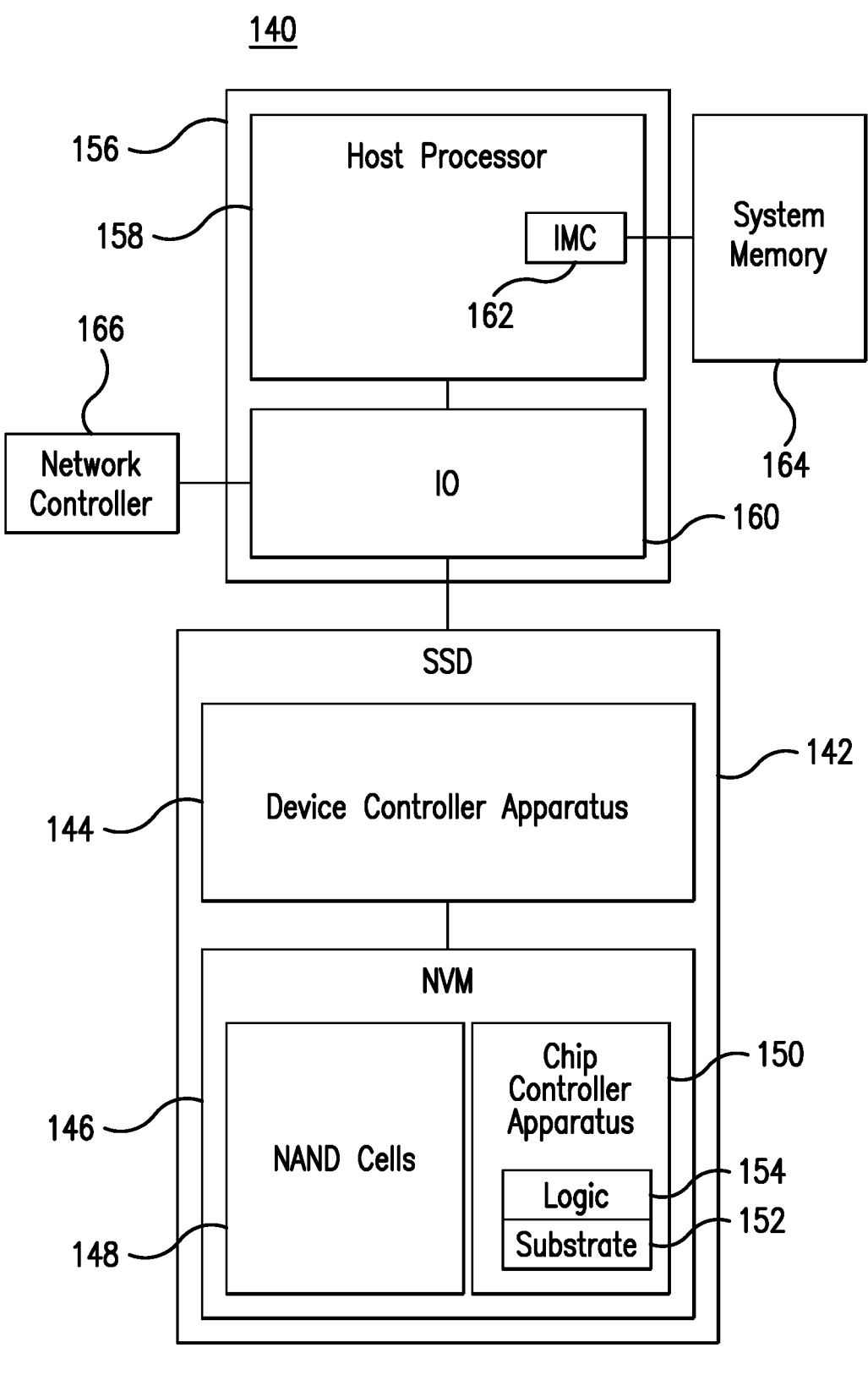
FIG. 6 is a block diagram of an example of a performance-enhanced computing system according to an embodiment.

Turning now to FIG. 6, a performance-enhanced computing system 140 is shown. In the illustrated example, a solid state drive (SSD) 142 includes a device controller apparatus 144 that is coupled to a non-volatile memory (NVM) 146. The illustrated NVM 146 includes a set of NAND cells 148 (e.g., NAND memory array) and a memory chip controller apparatus 150 coupled to the NAND cells 148, wherein the chip controller apparatus includes a substrate 152 (e.g., silicon, sapphire, gallium arsenide) and logic 154 (e.g., transistor array and other integrated circuit/IC components) coupled to the substrate 152. The logic 154, which may include one or more of configurable or fixed-functionality hardware, may be configured to perform one or more aspects of the method 50 (FIG. 3), the method 60 (FIG. 4) and/or the method 70 (FIG. 5), already discussed.

More particularly, the logic 154 may issue a program pulse to a selected subblock of the NAND cells 148, conduct a pulse recovery phase after the program pulse, and shut down unselected subblocks in the NAND cells 148 during the pulse recovery phase. The chip controller apparatus 150 and/or the computing system 140 are therefore considered performance-enhanced at least to the extent that shutting down the unselected subblocks during the pulse recovery phase decreases power consumption, improves scalability and/or increases storage density.

The illustrated system 140 also includes a system on chip (SoC) 156 having a host processor 158 (e.g., central processing unit/CPU) and an input/output (IO) module 160. The host processor 158 may include an integrated memory controller 162 (IMC) that communicates with system memory 164 (e.g., RAM dual inline memory modules/DIMMs). The illustrated IO module 160 is coupled to the SSD 142 as well as other system components such as a network controller 166.

In one example, the logic 154 includes transistor channel regions that are positioned (e.g., embedded) within the substrate 152. Thus, the interface between the logic 154 and the substrate 152 may not be an abrupt junction. The logic 154 may also be considered to include an epitaxial layer that is grown on an initial wafer of the substrate 152.

ADDITIONAL NOTES AND EXAMPLES

Example 1 includes a memory chip controller comprising one or more substrates and logic coupled to the one or more substrates, wherein the logic is implemented at least partly in one or more of configurable or fixed-functionality hardware, the logic to issue a program pulse to a selected subblock of a NAND memory array, conduct a pulse recovery phase after the program pulse, and shut down unselected subblocks in the NAND memory array during the pulse recovery phase.

Example 2 includes the memory chip controller of Example 1, wherein the unselected subblocks are to include a first set of unselected subblocks that share a source-side select gate with the selected subblock and a second set of unselected subblocks that do not share the source-side select gate with the selected subblock.

Example 3 includes the memory chip controller of Example 2, wherein the logic is further to apply a verify voltage to selected word lines in the NAND memory array, conduct a verify recovery phase after application of the verify voltage to the selected word lines, shut down one or more subblocks in the first set of unselected subblocks during the verify recovery phase, and shut down one or more subblocks in the second set of unselected subblocks during the verify recovery phase.

Example 4 includes the memory chip controller of Example 3, wherein the logic is further to turn on one or more subblocks in the first set of unselected subblocks based on a loop type associated with the program pulse.

Example 5 includes the memory chip controller of Example 1, wherein to conduct the pulse recovery phase, the logic is to apply an inhibit voltage to unselected word lines in the NAND memory array, and apply a pass voltage to word lines and select gates in the NAND memory array, wherein the unselected subblocks are shut down while the pass voltage is applied.

Example 6 includes the memory chip controller of any one of Examples 1 to 5, wherein the selected subblock is to be located at an intersection of a drain-side select gate and a word line.

Example 7 includes the memory chip controller of any one of Examples 1 to 5, wherein the logic is to adjust a bias of the unselected subblocks.

Example 8 includes the memory chip controller of Example 7, wherein the bias is adjusted based on a leakage constraint.

Example 9 includes a performance-enhanced computing system comprising a NAND memory array, and a memory chip controller coupled to the NAND memory array, wherein the memory chip controller includes logic implemented at least partly in one or more of configurable or fixed-functionality hardware, the logic to issue a program pulse to a selected subblock of the NAND memory array, conduct a pulse recovery phase after the program pulse, and shut down unselected subblocks in the NAND memory array during the pulse recovery phase.

Example 10 includes the computing system of Example 9, wherein the unselected subblocks are to include a first set of unselected subblocks that share a source-side select gate with the selected subblock and a second set of unselected subblocks that do not share the source-side select gate with the selected subblock.

Example 11 includes the computing system of Example 10, wherein the logic is further to apply a verify voltage to selected word lines in the NAND memory array, conduct a verify recovery phase after application of the verify voltage to the selected word lines, shut down one or more subblocks in the first set of unselected subblocks during the verify recovery phase, and shut down one or more subblocks in the second set of unselected subblocks during the verify recovery phase.

Example 12 includes the computing system of Example 11, wherein the logic is further to turn on one or more subblocks in the first set of unselected subblocks based on a loop type associated with the program pulse.

Example 13 includes the computing system of Example 9, wherein to conduct the pulse recovery phase, the logic is to apply an inhibit voltage to unselected word lines in the NAND memory array, and apply a pass voltage to word lines and select gates in the NAND memory array, wherein the unselected subblocks are shut down while the pass voltage is applied.

Example 14 includes the computing system of any one of Examples 9 to 13, wherein the selected subblock is to be located at an intersection of a drain-side select gate and a word line.

Example 15 includes the computing system of any one of Examples 9 to 13, wherein the logic is to adjust a bias of the unselected subblocks.

Example 16 includes the computing system of Example 15, wherein the bias is adjusted based on a leakage constraint.

Example 17 includes a method of operating a memory chip controller, the method comprising issuing a program pulse to a selected subblock of a NAND memory array, conducting a pulse recovery phase after the program pulse, and shutting down unselected subblocks in the NAND memory array during the pulse recovery phase.

Example 18 includes the method of Example 17, wherein the unselected subblocks include a first set of unselected subblocks that share a source-side select gate with the selected subblock and a second set of unselected subblocks that do not share the source-side select gate with the selected subblock.

Example 19 includes the method of Example 18, further including applying a verify voltage to selected word lines in the NAND memory array, conducting a verify recovery phase after application of the verify voltage to the selected word lines, shutting down one or more subblocks in the first set of unselected subblocks during the verify recovery phase, and shutting down one or more subblocks in the second set of unselected subblocks during the verify recovery phase.

Example 20 includes the method of Example 19, further including turning on one or more subblocks in the first set of unselected subblocks based on a loop type associated with the program pulse.

Example 21 includes an apparatus comprising means for performing the method of any one of Examples 17 to 20.

Technology described herein therefore relies on preventive measures to avoid introducing unnecessary charges into the array instead of relying on array discharge to protect the boosting. Waveforms that control the different types of select gates (SGSs and SGDs) are modified to prevent introducing electrons into the unselected SGDs and minimize current leakage. This approach eliminates or significantly reduces the need to perform array discharge on unselected subblocks, which can therefore be disconnected completely during array discharge operation. As a result, array capacitance experienced during the high-voltage discharge sequence is significantly reduced, which in turn substantially improves programming power. The programming power savings can be achieved in single-level cell (SLC, e.g., one bit per cell) configurations, multi-level cell (MLC, e.g., two bits per cell) configurations, triple-level cell (TLC, e.g., three bits per cell) configurations, quad-level cell (QLC, e.g., four bits per cell) configurations, penta-level cell (PLC, e.g., five bits per cell) configurations, and so forth.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrases "one or more of A, B or C" may mean A; B; C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. A memory chip controller comprising:

one or more substrates; and logic coupled to the one or more substrates, wherein the logic is implemented at least partly in one or more of configurable or fixed-functionality hardware, the logic to:

issue a program pulse to a selected subblock of a NAND memory array;

conduct a pulse recovery phase after the program pulse, including during the pulse recovery phase, applying an inhibit voltage to a selected word line coupled to the selected subblock, and controlling the selected word line to drop from the inhibit voltage to a pass voltage that is above a ground level; and shut down unselected subblocks in the NAND memory array during the pulse recovery phase.

2. The memory chip controller of claim 1, wherein the unselected subblocks include a first set of unselected subblocks that share a source-side select gate with the selected subblock and a second set of unselected subblocks that do not share the source-side select gate with the selected subblock.

3. The memory chip controller of claim 2, wherein the logic is further to:

apply a verify voltage to the selected word line in the NAND memory array;

conduct a verify recovery phase after application of the verify voltage to the selected word line;

shut down one or more subblocks in the first set of unselected subblocks during the verify recovery phase; and shut down one or more subblocks in the second set of unselected subblocks during the verify recovery phase.

4. The memory chip controller of claim 3, wherein the logic is further to turn on the one or more subblocks in the first set of unselected subblocks based on a loop type associated with the program pulse.

5. The memory chip controller of claim 1, wherein to conduct the pulse recovery phase, the logic is to:

apply the inhibit voltage to one or more unselected word lines in the NAND memory array; and apply the pass voltage to a set of word lines and select gates in the NAND memory array, wherein the unselected subblocks are shut down while the pass volage is applied.

6. The memory chip controller of claim 1, wherein the selected subblock is to be located at an intersection of a drain-side select gate and a word line.

7. The memory chip controller of claim 1, wherein the logic is to adjust a bias of the unselected subblocks based on a leakage constraint.

8. The memory chip controller of claim 1, wherein the program pulse corresponds to a program voltage that is higher than the inhibit voltage, and the program voltage, the inhibit voltage, and the pass voltage are three successively dropping voltage steps applied on the selected word line.

9. The memory chip controller of claim 1, wherein while the program pulse is applied on the selected word line, the inhibit voltage is applied to an unselected word line and extended to the pulse recovery phase.

10. A computing system comprising:

a NAND memory array; and a memory chip controller coupled to the NAND memory array, wherein the memory chip controller includes logic implemented at least partly in one or more of configurable or fixed-functionality hardware, the logic to:

issue a program pulse to selected subblock of the NAND memory array;

conduct a pulse recovery phase after the program pulse, including during the pulse recovery phase, applying an inhibit voltage to a selected word line coupled to the selected subblock, and controlling the selected word line to drop from the inhibit voltage to a pass voltage that is above a ground level; and shut down unselected subblocks in the NAND memory array during the pulse recovery phase.

11. The computing system of claim 10, wherein the unselected subblocks include a first set of unselected subblocks that share a source-side select gate with the selected subblock and a second set of unselected subblocks that do not share the source-side select gate with the selected subblock.

12. The computing system of claim 11, wherein the logic is further to:

apply a verify voltage to the selected word line in the NAND memory array;

conduct a verify recovery phase after application of the verify voltage to the selected word line;

shut down one or more subblocks in the first set of unselected subblocks during the verify recovery phase; and shut down one or more subblocks in the second set of unselected subblocks during the verify recovery phase.

13. The computing system of claim 12, wherein the logic is further to turn on the one or more subblocks in the first set of unselected subblocks based on a loop type associated with the program pulse.

14. The computing system of claim 10, wherein to conduct the pulse recovery phase, the logic is to:

apply the inhibit voltage to one or more unselected word lines in the NAND memory array and apply the pass voltage to a set of word lines and select gates in the NAND memory array, wherein the unselected subblocks are shut down while the pass volage is applied.

15. The computing system of claim 10, wherein the selected subblock is to be located at an intersection of a drain-side select gate and a word line.

16. The computing system of claim 10, wherein the logic is to adjust a bias of the unselected subblocks based on a leakage constraint.

17. A method comprising:

issuing a program pulse to a selected subblock of a NAND memory array;

conducting a pulse recovery phase after the program pulse, including during the pulse recovery phase, applying an inhibit voltage to a selected word line coupled to the selected subblock, and controlling the selected word line to drop from the inhibit voltage to a pass voltage that is above a ground level; and shutting down unselected subblocks in the NAND memory array during the pulse recovery phase.

18. The method of claim 17, wherein the unselected subblocks include a first set of unselected subblocks that share a source-side select gate with the selected subblock and a second set of unselected subblocks that do not share the source-side select gate with the selected subblock.

19. The method of claim 18, further including:

applying a verify voltage to the selected word line in the NAND memory array;

conducting a verify recovery phase after application of the verify voltage to the selected word line;

shutting down one or more subblocks in the first set of unselected subblocks during the verify recovery phase; and shutting down one or more subblocks in the second set of unselected subblocks during the verify recovery phase.

20. The method of claim 19, further including turning on the one or more subblocks in the first set of unselected subblocks based on a loop type associated with the program pulse.

* * * * *